US006787010B2

(12) United States Patent
Cuomo et al.

(10) Patent No.: US 6,787,010 B2
(45) Date of Patent: Sep. 7, 2004

(54) NON-THERMIONIC SPUTTER MATERIAL TRANSPORT DEVICE, METHODS OF USE, AND MATERIALS PRODUCED THEREBY

(75) Inventors: Jerome J. Cuomo, Cary, NC (US); N. Mark Williams, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/997,162

(22) Filed: Nov. 29, 2001

(65) Prior Publication Data

US 2002/0108847 A1 Aug. 15, 2002

Related U.S. Application Data

(60) Provisional application No. 60/250,297, filed on Nov. 30, 2000.

(51) Int. Cl.$^7$ ............................ C23C 14/35; C23C 16/00
(52) U.S. Cl. ............................ 204/298.07; 204/298.06; 204/298.09; 204/298.11; 204/298.16; 204/298.19; 118/723 MP; 118/715; 156/345.33; 156/345.37; 156/345.38
(58) Field of Search ........................ 204/192.12, 298.06, 204/298.07, 298.09, 298.11, 298.16, 298.19; 156/345.33, 345.37, 345.38; 118/723 MP, 715

(56) References Cited

U.S. PATENT DOCUMENTS

| 3,600,218 | A |   | 8/1971  | Pennebaker |
| 3,609,471 | A |   | 9/1971  | Scace et al. |
| 3,716,759 | A |   | 2/1973  | Scace et al. |
| 4,394,400 | A |   | 7/1983  | Green et al. |
| 4,407,712 | A |   | 10/1983 | Henshaw et al. |
| 4,431,473 | A |   | 2/1984  | Okano et al. |
| 4,521,286 | A |   | 6/1985  | Horwitz |
| 4,588,490 | A | * | 5/1986  | Cuomo et al. ......... 204/192.12 |

(List continued on next page.)

FOREIGN PATENT DOCUMENTS

JP          63-307254       12/1988

OTHER PUBLICATIONS

Huang et al., "Room–Temperature Ultraviolet Nanowire Nanolasers," Science, vol. 292, pp. 1897–1899, ( Jun. 8, 2001).

(List continued on next page.)

Primary Examiner—Rodney G. McDonald
(74) Attorney, Agent, or Firm—Jenkins, & Wilson & Taylor, P.A.

(57) ABSTRACT

A sputter transport device comprises a sealed chamber, a negatively-biased target cathode holder disposed in the chamber, and a substrate holder disposed in the chamber and spaced at a distance from the target cathode. A target cathode is bonded to the target cathode holder. A magnetron assembly is disposed in the chamber proximate to the target cathode. A negatively-biased, non-thermionic electron/plasma injector assembly is disposed between the target cathode and the substrate holder. The injector assembly fluidly communicates with a gas source and includes a plurality of hollow cathodes. Each hollow cathode includes an orifice communicating with the chamber. The device can be used to produce thin-films and ultra-thick materials in polycrystalline, single-crystal and epitaxial forms, and thus to produce articles and devices that are useful as metallic or insulating coatings, and as bulk semiconductor and optoelectronic materials.

57 Claims, 12 Drawing Sheets

U.S. PATENT DOCUMENTS

| | | | |
|---|---|---|---|
| 4,637,853 A | 1/1987 | Bumble et al. | |
| 4,727,047 A | 2/1988 | Bozler et al. | |
| 4,824,544 A * | 4/1989 | Mikalesen et al. | 204/298.11 |
| 4,915,805 A | 4/1990 | Rust | |
| 4,959,136 A | 9/1990 | Hatwar | |
| 4,963,239 A | 10/1990 | Shimamura et al. | |
| 4,966,677 A | 10/1990 | Aichert et al. | |
| 4,985,742 A | 1/1991 | Pankove | |
| 5,073,245 A | 12/1991 | Hedgcoth | |
| 5,228,963 A | 7/1993 | Rose | |
| 5,234,560 A | 8/1993 | Kadlec et al. | |
| 5,270,263 A | 12/1993 | Kim et al. | |
| 5,290,393 A | 3/1994 | Nakamura | |
| 5,306,662 A | 4/1994 | Nakamura et al. | |
| 5,356,608 A | 10/1994 | Gebhardt | |
| 5,393,993 A | 2/1995 | Edmond et al. | |
| 5,482,611 A * | 1/1996 | Helmer et al. | 204/298.17 |
| 5,556,519 A * | 9/1996 | Teer | 204/192.12 |
| 5,573,742 A | 11/1996 | Gebhardt | |
| 5,587,014 A | 12/1996 | Iyechika et al. | 117/90 |
| 5,620,557 A | 4/1997 | Manabe et al. | |
| 5,637,531 A | 6/1997 | Porowski et al. | 117/89 |
| 5,679,152 A | 10/1997 | Tischler et al. | |
| 5,786,606 A | 7/1998 | Nishio et al. | |
| 5,838,029 A | 11/1998 | Shakuda | |
| 5,858,086 A | 1/1999 | Hunter | |
| 5,868,837 A | 2/1999 | DiSalvo et al. | 1/1 |
| 5,876,573 A * | 3/1999 | Moslehi et al. | 204/192.12 |
| 5,915,194 A | 6/1999 | Powell et al. | |
| 5,919,305 A | 7/1999 | Solomon | |
| 5,954,874 A | 9/1999 | Hunter | |
| 5,962,875 A | 10/1999 | Motoki et al. | |
| 5,970,314 A | 10/1999 | Okahisa et al. | 438/47 |
| 5,972,109 A | 10/1999 | Hunter | |
| 6,020,602 A | 2/2000 | Sugawara et al. | |
| 6,045,612 A | 4/2000 | Hunter | |
| 6,063,185 A | 5/2000 | Hunter | |
| 6,066,205 A | 5/2000 | Hunter | |
| 6,071,795 A | 6/2000 | Cheung et al. | 438/458 |
| 6,096,130 A | 8/2000 | Kimura et al. | 117/89 |
| 6,136,093 A | 10/2000 | Shiomi et al. | 117/104 |
| 6,146,457 A | 11/2000 | Solomon | |
| 6,153,010 A | 11/2000 | Kiyoku et al. | |
| 6,177,688 B1 | 1/2001 | Linthicum et al. | |
| 6,218,280 B1 | 4/2001 | Kryliouk et al. | 438/607 |
| 6,221,684 B1 | 4/2001 | Sugawara et al. | |
| 6,225,650 B1 | 5/2001 | Tadatomo et al. | |
| 6,252,261 B1 | 6/2001 | Usui et al. | 257/190 |
| 6,254,675 B1 | 7/2001 | Aldinger et al. | 117/89 |
| 6,255,198 B1 | 7/2001 | Linthicum et al. | |
| 6,265,289 B1 | 7/2001 | Zheleva et al. | |
| 6,270,569 B1 | 8/2001 | Shibata et al. | 117/68 |
| 6,273,948 B1 | 8/2001 | Porowski et al. | 117/72 |
| 6,277,664 B1 | 8/2001 | Lozykowski et al. | 438/22 |
| 6,288,417 B1 | 9/2001 | Nickel et al. | |
| 6,290,774 B1 | 9/2001 | Solomon et al. | 117/89 |
| 6,350,666 B2 | 2/2002 | Kryliouk | 438/604 |
| 6,372,041 B1 | 4/2002 | Cho et al. | 117/84 |
| 6,398,867 B1 | 6/2002 | D'Evelyn et al. | 117/11 |
| 6,406,540 B1 | 6/2002 | Harris et al. | 117/104 |
| 6,407,409 B2 | 6/2002 | Cho et al. | 257/78 |
| 6,413,627 B1 | 7/2002 | Motoki et al. | 428/332 |
| 6,440,823 B1 | 8/2002 | Vaudo et al. | 438/478 |
| 6,468,347 B1 | 10/2002 | Motoki et al. | 117/89 |
| 2001/0008656 A1 | 7/2001 | Tischler et al. | |

OTHER PUBLICATIONS

Yoshizawa et al., "Growth of Self–Organized GaN Nanostructures on Al2O3(0001) by RF–Radical Source Molecular Beam Epitaxy," Jpn. J. Appl. Phys., vol. 36, pp. L459–L462, (Apr. 15, 1997).

Kusakabe et al., "Characterization of Overgrown–GaN–Layers on Nano–Columns Grown by RF–Molecular Beam Epitaxy," Jpn. J. Appl. Phys., vol. 40, pp. L192–L194, (Mar. 1, 2001).

Hashimoto et al., "Formation of GaN Nano–Column Structure by Nitridation," Materials Science Forum, Trans Tech Publications, Ltd. (Switzerland), vols. 264–268, pp. 1129–1132, (Jul. 1, 1998).

* cited by examiner

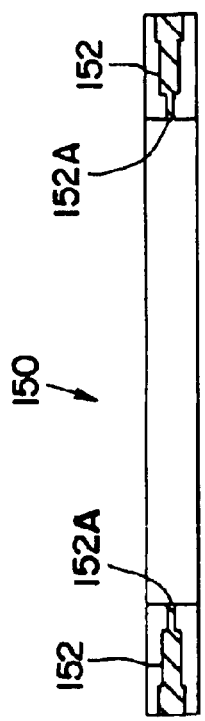
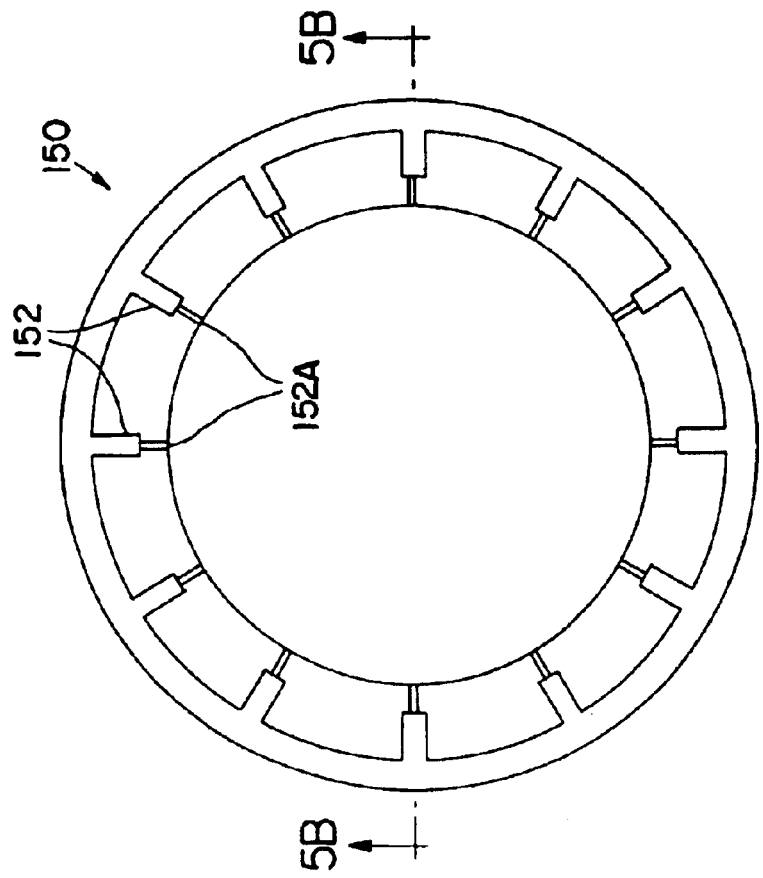

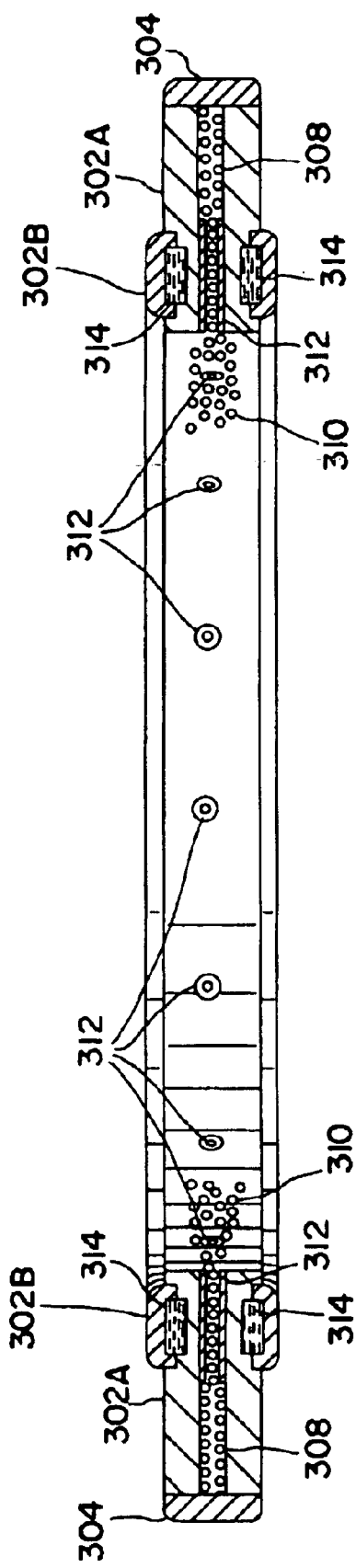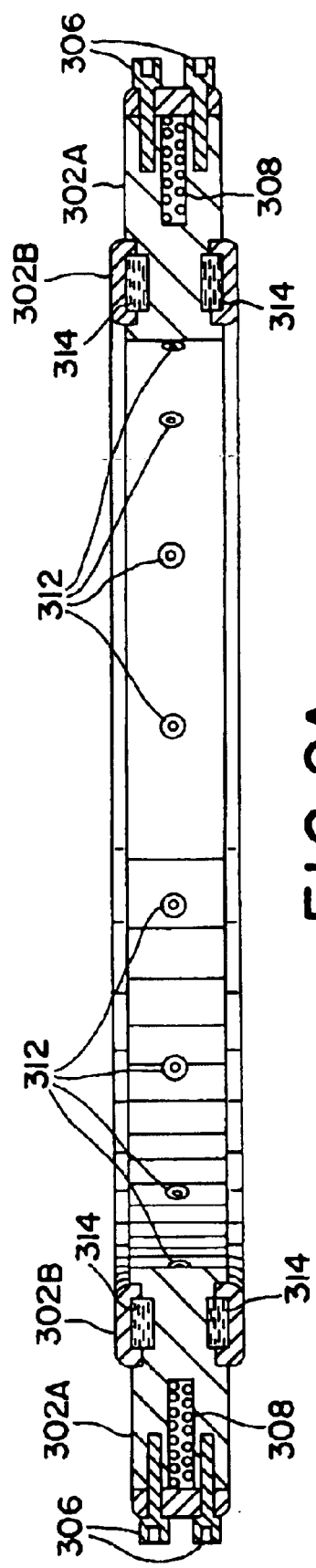
FIG. 9B
FIG. 9A

NON-THERMIONIC SPUTTER MATERIAL TRANSPORT DEVICE, METHODS OF USE, AND MATERIALS PRODUCED THEREBY

RELATED APPLICATIONS

This application claims the benefit of U.S. Provisional Patent Application Ser. No. 60/250,297, filed Nov. 30, 2000, the disclosure of which is incorporated herein by reference in its entirety.

TECHNICAL FIELD

The present invention is generally directed to deposition of thin films and growth of bulk materials. In particular, the present invention is directed to non-thermionic, plasma-enhanced sputtering techniques.

BACKGROUND ART

A wide variety of techniques exist for depositing thin films onto substrates in order to achieve desirable properties which are either different from, similar to, or superior to the properties of the substrates themselves. Thin films are employed in many kinds of optical, electrical, magnetic, chemical, mechanical and thermal applications. Optical applications include reflective/anti-reflective coatings, interference filters, memory storage in compact disc form, and waveguides. Electrical applications include insulating, conducting and semiconductor devices, as well as piezoelectric drivers. Magnetic applications include memory discs. Chemical applications include barriers to diffusion or alloying (e.g., galling), protection against oxidation or corrosion, and gas or liquid sensors. Mechanical applications include tribological (wear-resistant) coatings, materials having desirable hardness or adhesion properties, and micromechanics. Thermal applications include barrier layers and heat sinks. Bulk materials can be used as substrates upon which thin films can be deposited and microelectronic and optical devices can be fabricated.

Thin-film techniques typically entail several sequential process steps. Generally, a source of film-forming material is supplied, the material is transported to the substrate, and deposition occurs on the substrate surface. The material transport step occurs in a contained environment such as a chamber containing a vacuum, one or more gaseous fluids, and/or a plasma medium. Deposition behavior is determined not only by the source and transport factors but also by deposition surface factors. Such surface factors include the substrate surface condition (e.g., surface roughness, contamination, degree of chemical bonding between the surface and the arriving material, and crystallographic or epitaxial parameters); the reactivity of the arriving material (e.g., the sticking coefficient, which provides an indication of the probability of arriving molecules reacting with the surface and becoming incorporated into the film); and the energy input (e.g., substrate temperature, positive-ion bombardment, and chemical reactions). The results of the deposition can be analyzed, and one or more process conditions can be modified as appropriate in order to obtain the specific film properties desired. Process control and monitoring steps are usually carried out at all key points along the process. Post-deposition annealing procedures can also be employed to activate grain growth, alter stoichiometry, introduce dopants, or deliberately cause oxidation.

Deposition processes are broadly delineated into "physical" vapor deposition (PVD) processes and "chemical" vapor deposition (CVD) processes, although some processes might better be characterized as being hybrids of PVD and CVD processes. The source of material supplied to the deposition system can be a solid, liquid, vapor, or gas. Solid materials must be vaporized in a PVD process in order to transport them to the substrate. Vaporization is accomplished either by employing a thermal technique (e.g., evaporation) or by providing an energetic beam of electrons, photons (e.g., laser ablation), or positive ions (e.g., sputtering). On the other hand, CVD techniques utilize gases, evaporated liquids, or chemically gasified solids as source materials. In both PVD and CVD processes, contamination is a critical factor during the source supply step, as well as in the transport and deposition steps. The source supply rate is also a critical factor, as film properties can vary with deposition rate and, in the case of compound films, with the ratio of elements supplied.

One common PVD process entails thermal evaporation, which is often accomplished by using a twisted-wire coil, a dimpled sheet-metal "evaporation boat," or a heat-shielded crucible. In thermal evaporation, thermal energy alone (i.e., joule heating) is utilized to drive the evaporation, reaction and film structure development. On the other hand, several known deposition processes exist in which the primary source of energy can be characterized as being essentially "nonthermal." In these "energy-beam" techniques, energy is delivered by electrons, photons or ions (usually positive ions) to vaporize the source material, activate the source material during transport, or modify film structure during deposition. Common energy-beam techniques used to carry out vaporization can be broadly categorized as electron-beam, cathodic-arc, anodic-arc, pulsed-laser, ion-beam sputtering, and glow-discharge sputtering processes. Clear differences exist between the first four techniques and the two sputtering techniques. In the first four techniques, electrons (via an electron beam), ions (via an arc) or photons (via a pulsed laser) are directed at the source material in a narrow beam having a diameter of approximately a few millimeters. Conversely, the ion beams and glow discharges employed in the sputtering techniques cover a much broader area. Additionally, the use of narrow beams leads to intense heating of the source material at the point of impact, so that the vaporization mechanism is thermal even though the energy input is non-thermal. By contrast, vaporization by sputtering involves direct momentum transfer from bombarding ions to the surface atoms of a relatively cool source material.

There are several advantages to using energy beams for vaporization as compared to joule-heated sources. First, virtually any material, no matter how refractory, can be vaporized. In the narrow-beam processes, this is a result of the very high energy density and surface temperature that is achieved. In sputtering, the advantage results from the fact that the bombarding ions have energies far exceeding chemical-bond strengths which typically are only a few electron volts (one electron volt, or 1 eV, will be understood as constituting the energy gain of a particle having one electronic charge upon passing through a potential drop of one volt). Second, in the cases of pulsed-laser evaporation and sputtering, the activated depth of source material can be in the range of only tens of nanometers, which results in stoichiometric (congruent) vaporization of multi-element materials, thereby assisting (albeit not necessarily guaranteeing) a stoichiometric deposit. Third, in all of the energy-beam processes, much of the vapor acquires energy well above the thermal energy of the surface of the source material, and this energy can greatly assist the deposition process. Atoms thermally evaporated by narrow energy beams acquire most of their energy by interaction with the beam in the vapor phase, while sputtered atoms have high energies at the time they leave the surface of the source material. In the case of ionized vapor, this energy can be further increased by accelerating ions toward the surface of the depositing film, which is accomplished by applying a negative bias to the substrate. Energy can also be directed at the deposition surface through the mechanism of either energetic-atom condensation or ion bombardment, which can result in significant improvement in film adherence and structure.

FIG. 1 illustrates the widely used parallel-plate plasma configuration, commonly known as a planar diode and generally designated 10. Two electrodes, a cathode 12 and an anode 14, are parallel to each other and spaced apart from each other by a distance or electrode gap L. Anode 14 can be at ground or alternatively driven with an RF bias source 16 and associated capacitor 16A (shown in phantom), and cathode 12 is driven negative by a power supply 18. A glow-discharge plasma 20 is generated between the two electrodes and confined by a grounded metal vacuum containment wall 22. The bulk of plasma 20 floats above ground by the plasma potential, and has little voltage drop across it because of its high conductivity relative to that of its sheaths. This means that essentially all of the applied voltage appears across the cathode sheath. This voltage drop results in high-energy ion bombardment of cathode 12 by positive ions 24 and sputtering of cathode 12 as represented by sputtered atom 26. The cathode voltage drop also sustains plasma 18 by accelerating secondary electrons 28 emitted from cathode 12 into plasma 18 where they initiate a cascade of ionizing collisions. As illustrated, diode 10 can be operated under an applied DC voltage or an RF voltage.

The DC parallel-plate glow discharge typically operates at a pressure in the approximately 3–300 Pa range and at an applied voltage of approximately 1000–2000 V. The exact pressure range will depend on electrode gap L and gas composition. At pressures below the limit, not enough collisions occur before the electrons reach anode 14. At higher pressures, the discharge tends to switch to the concentrated, low-voltage arc mode, especially at high power. The high voltage of the DC glow discharge is required so that each secondary electron 28 emitted from cathode 12 can produce enough ionizing collisions before losing its energy. A small increase in voltage results in a large increase in current because of the cascade effect, so for good power control a current-regulated power supply is used. To "strike" (initiate) the discharge, it is often necessary to supply a spike of higher voltage, or to adjust pressure to a minimum so that the gas will break down at the voltage available.

Secondary electrons 28 emitted from cathode 12 first cross a "dark space" generally designated 30. This region is "dark" because an insufficient number of inelastic collisions with molecules occur for any glow from the excited states of the molecules to be observed. The width of dark space 30 may be smaller than that of the sheath at high pressure and low plasma density, or it may be greater in the opposite case. Since the electrons follow the sheath field, which is perpendicular to the cathode surface, the electrons travel in a broad parallel beam and accordingly are known as "beam" electrons. After acceleration, the beam electrons pass into the "negative glow" region of plasma 20, where they ionize gas molecules and lose their directionality due to scattering. If electrode gap L is smaller than the width of the negative glow, the beam electrons are likely to reach anode 14 before undergoing an ionizing collision. Such a discharge is said to be "obstructed," and any further decrease in electrode gap L causes a sharp rise in voltage and ultimately extinction of plasma 20. The width of the negative glow is roughly equal to the mean free path for ionizing collisions. Undesired discharges along the back of cathode 12 and its voltage lead 32 can be prevented by installing a grounded "dark-space shield" (not shown) along these surfaces.

A mode of plasma-enhanced chemical activation generally known as "reactive sputtering" uses a sputtered source material along with a gaseous one. The gas becomes dissociated in the sputtering plasma and reacts to form a compound film. The parallel-plate plasma configuration of FIG. 1 can be used to supply vapor for film deposition by sputter-erosion of cathode 12, which in this case is termed the "target" material. Often, the plasma is magnetized using a magnetron assembly generally designated 40, as described hereinbelow. In either case, cathode 12 is bombarded by plasma ions 24 having energies approaching the externally applied voltage, although ion energy is distributed downwardly by scattering in the sheath. Chief effects of the plasma on sputtering process behavior are: (1) reactive sputtering, (2) scattering of the particles by the plasma gas, (3) negative-ion ejection from the target, and (4) resputtering. Resputtering involves the acceleration of plasma ions into the substrate using a negative bias. The resultant resputtering of the depositing film can produce effective planarization of rough topography, and the bombardment can modify film structure in various known ways.

In the technique of reactive sputtering, a reactive gas (e.g., $N_2$) is added to the sputtering plasma (e.g., argon gas plasma) in order to shift compound-film stoichiometry in sputtering from a compound target, or to deposit a compound film from a metallic target (e.g., Al). Compound deposition by reactive sputtering from a metallic target generally lowers target fabrication costs and increases target purity as compared to using a compound target, but process control can be more difficult if film composition is critical.

Even at the lowest operable pressure of the DC-diode plasma, there is considerable gas scattering of sputtered particles as they cross the plasma, with consequent loss of their desirable kinetic energy and loss of deposition rate by backscattering. Magnetic confinement is widely used to reduce minimum pressure and thus avoid these problems. Scattering of the sputtered particles also broadens their spread of incident angles at the substrate. Thermalization and spreading together cause a generally undesirable shift in film microstructure from a bombardment-compacted structure (e.g., "Zone T") to the more porous and weakly bonded structure (e.g., "Zone 1"). Operation at lower plasma pressure using magnetron assembly 40 avoids this problem.

With respect to negative ions ejected from a compound target, when one element has a low ionization potential (e.g., 6 eV) and the other has a high electron affinity (e.g., 2 eV) so that the difference between the two becomes small, it is likely that the latter element will be sputtered as a negative ion rather than as a neutral atom. Negative ions are accelerated into the plasma along with the beam electrons by the cathode sheath field. For pressures above about 1 Pa, the negative ions will be stripped of the extra electron in the plasma. But unless the product of electrode gap L and gas pressure is very high, the ion can still cross to the depositing film and bombard it with enough energy to damage or erode the film. When the negative-ion flux is substantial in glow-discharge sputtering of compounds, problems can be encountered at both low and high operating pressures. At low pressure, the desirable kinetic energy of the sputtered particles is retained but negative-ion damage can result. At high pressure, the undesirable negative-ion energy is dissipated but Zone T film structure can be lost as a result of thermalization and scattering.

When employing a planar-diode plasma configuration to cause sputtering, the beam electrons ejected from cathode 12 must undergo enough ionizing collisions with the gas to sustain plasma 20 before the beam electrons reach anode 14 and are removed there. This requirement places a lower limit on operating pressure, and can be enhanced through the use of magnetron assembly 40, as illustrated in FIG. 1. Magnetron assembly 40 typically includes a central bar magnet 42 and an outer ring magnet or magnets 44 of opposite pole. Magnetron 40 produces a cross-wise magnetic field over cathode 12. The magnetic field traps the beam electrons in orbits near the cathode surface. As a result, the path lengths of the beam electrons are significantly increased before the electrons finally escape to anode 14 by collisional scattering. Because the paths of the electrons become longer than electrode gap L, the minimum pressure needed to sustain plasma 20 is much lower (typically 0.1 Pa rather than 3 Pa) when using magnetron 40 as compared with planar diode 10 without magnetron 40. At a lower pressure (e.g., 0.1 Pa), the sputtered particles retain most of their kinetic energy upon reaching the substrate, and this energy has advantageous effects on the structure of the depositing film. In addition, deposition rate is increased due to reduced scattering and redeposition of sputtered particles on cathode 12. Moreover, the beam electrons are utilized more efficiently, with the result that a lower applied voltage (e.g., approximately 500 V) is required to sustain a plasma of a given density, and the voltage increases less steeply with power input as compared to a non-magnetron planar diode configuration. Negative ions can still be a problem, however. Also, a highly non-uniform erosion pattern appears on the target cathode surface. If negative ions influence the film during deposition, this pattern can become imprinted on the film as it is being deposited on a stationary substrate as a result of the beam nature of the negative ions. However, since the sputtered particles are neutral and are emitted in a generally cosine distribution, the non-uniformity of the deposition rate is less sharply imprinted on the film. It should also be noted that, as in the case of planar diodes, magnetrons can be operated under RF excitation if power is to be coupled through insulating targets.

Referring to FIGS. 1 and 2, magnetron 40 has a planar, circular configuration. The target material of cathode 12 is a disc, typically 3–10 mm thick, and is bonded (such as by soldering, for good thermal contact) to a water-cooled copper backing plate 50. The water coolant can be deionized to prevent electrolytic corrosion between electrically biased backing plate 50 and a grounded water supply 52. Cathode 12 is often floated off ground with a ceramic insulating ring (not shown). Containment wall 22 serves as an anode, although grounded shields (not shown) can be added to confine the sputtered material. The cross-wise magnetic field is established by magnets 42 and 44. Magnets 42 and 44 are connected on the back by an iron "field-return" plate 46 to complete the magnetic circuit and to confine the magnetic field.

Upon igniting plasma 20, beam electrons emitted from cathode 12 are accelerated into plasma 20 by the electric field of the cathode sheath. The presence of the magnetic field, represented by virtual magnetic field lines B in FIG. 2, causes the beam electrons to curve into orbits as a result of the Lorentz force, $F=F_E+F_B=q_e E+q_e v \times B$. The radius of the orbit (referred to as the gyratron, cyclotron or Larmor radius) depends on the strength of the magnetic field and on the electron velocity component perpendicular to the magnetic field. In order for the magnetic field to have an effect on the beam electrons, the pressure must be low enough (typically less than a few Pa) that the electron mean free path is not significantly less than the orbit radius. If this condition is met, the beam electrons are said to be "magnetized" although the ions are not magnetized. Magnetron 40 can operate as a sputtering source at much higher pressures, but in such cases gas scattering dominates the behavior of the beam electrons instead of the magnetic field itself.

Under lower pressure conditions, the beam electrons emitted from the target surface of cathode 12 or created by ionization in the sheath field are accelerated vertically by the electric field and simultaneously forced sideways by the magnetic field. The beam electrons eventually reverse direction and return toward the target. As the beam electrons are thus directed toward the target, they decelerate in the electric field until their direction is again reversed, and the cycle repeats. As specifically shown in FIG. 2, the net motion or path of these electrons is a circular drift path, designated E×B, around the circle of the target. This drift path is in the direction of the E×B vector product. Magnetron 40 is ordinarily designed such that the E×B drift path closes on itself so that the beam electrons do not pile up or accumulate at some location.

Additionally, cathodic structures have been developed to enhance processing-scale plasmas such as magnetrons and RF diodes by taking advantage of the "hollow cathode" effect, a phenomenon which generally involves utilizing geometric means to trap secondary electrons emitted from an ion-bombarded target cathode. When a hollow-cathode-type structure is driven to a very high discharge current, its cathode surfaces heat to a temperature sufficient to cause thermionic emission of electrons, and the local plasma glow discharge will enter the arc mode. A hollow cathode, typically constructed of a refractory material and provided with a local gas supply, can be a useful source of moderately energetic electrons for plasmas.

Referring to FIG. 3, a sputter transport device generally designated 60 includes a planar configuration of a magnetron generally designated 62, a target cathode 64, a substrate holder 66, and a substrate 68, all of which are situated in a containment chamber 70. A hollow cathode generally designated 72 is provided in the form of a tube 72A having a tantalum tip 72B. A gas source (not specifically shown) is connected to one end of hollow cathode 72, and a small aperture or orifice 72C is provided at the tip. Aperture 72C restricts the gas flow and results in a large pressure differential across tip 72B. The inner pressure of hollow cathode 72 is typically in the range of several hundred mTorr. Electrons are emitted by biasing hollow cathode 72 negatively with respect to the local plasma potential (which is usually the ground potential). A hollow cathode having a diameter of only a few millimeters can be employed to produce an electron current of several to ten amperes. An external heater or a short-term, high-voltage spike is typically used to heat hollow cathode 72 to the temperature required for emission.

In FIG. 3, hollow cathode 72 is situated in the fringe region of the magnetic field of magnetron 62 to supply additional electrons to the magnetron discharge. Hollow cathode 72 serves to decouple the current-voltage relation of the diode plasma and allow operation of the plasma at wide ranges of voltage and current, as well as to lower the operating pressure in chamber 70. Hollow cathode 72 can operate at 0.1 mTorr, which is below the range of the more conventional magnetron/diode arrangement described hereinabove and illustrated in FIG. 1. If conventional magnetron/ diode arrangements were to operate at these lower pressures, there would be not be enough gas atoms for efficient ionization by the secondary electrons. The additional supply of electrons from hollow cathode 72, however, removes this limitation and allows operation at approximately 0.1 mTorr for magnetron arrangements, and approximately 0.5 mTorr for RF-diode arrangements. Such pressures are well into the long mean free path mode, and sputtered atoms or ions move in straight, line-of-sight trajectories without gas scattering.

A magnetron sputter device enhanced with a hollow cathode source capable of emitting a high electron current is disclosed in U.S. Pat. No. 4,588,490 to Cuomo et al., the specification of which is incorporated herein by reference. Similar to the apparatus illustrated in FIG. 3 of the present disclosure, the invention disclosed in U.S. Pat. No. 4,588, 490 combines a hollow cathode electron emitting device with a known plasma sputter etching/deposition device, in order to provide additional ionization of the working or background gas during normal magnetron operation and to provide gas ionization at low magnetron energies. The hollow cathode source is provided in the form of a tantalum tube, and is positioned such that it is immersed in the transverse magnetic field near the magnetron cathode target surface, but neither electrically nor physically impedes the magnetron E×B drift current. The discharge plasma initiated and maintained within the hollow cathode is thermionic in nature. The hollow cathode is biased negative with respect to plasma potential, which causes thermionic heating of the tantalum tip. The thermionically emitted electrons become trapped and distributed around the magnetron drift loop by a modified E×B effect. These electrons are energetic enough to cause ionization of the background gas and to ionize the argon gas flowing through the tantalum tip. The increased ionization forms a denser plasma, such as dense plasma region 76 in FIG. 3, than can be produced by the magnetron alone, which plasma is characterized by a lower impedance that results in increased currents at constant voltage.

While hollow cathode enhanced sputtering devices provide advantages over many of the other deposition techniques described hereinabove, there are still drawbacks with regard to their use, owing to the fact that they are thermionic emitting electron devices. For instance, contamination is still observed to be a problem, particularly since the hollow cathode tip material tends to evaporate and mix with the growing deposition material. Another problem relates to the intense heat produced by thermionic emission, which can damage the growing material.

The present invention is provided to address these and other problems associated with the growth of thin films and bulk materials.

DISCLOSURE OF THE INVENTION

The present invention provides a physical vapor deposition (PVD) technique enabled by a novel sputter material transport device to enhance thin-film and bulk material manufacturing processes. The novel transport device is capable of ultra-high deposition and growth rates, making it feasible for growing thick material and increasing throughput in manufacturing processes. The transport device can be used both to grow bulk crystalline materials and to deposit thin films and epitaxial layers onto bulk substrates. Generally, as compared to other sputter processes, the transport device of the present invention has the advantages of lowered processing pressure, higher deposition rates, higher ionization efficiency, and a controlled processing environment with no contamination. The novel device utilizes an enhanced sputtering process to rapidly deposit both metallic and dielectric materials. This enhancement allows the process to overcome the limitations of conventional PVD techniques.

The device according to the present invention can achieve growth rates in excess of ten times those achieved by any other direct deposition process. As currently tested, the device is capable of depositing single or polycrystalline material at a rate in excess of approximately 60 $\mu$m/hr. This high deposition rate allows for high throughput capabilities and the possibility of manufacturing bulk materials in short time periods. The device enables increased growth rates due to the very high ionization efficiencies, which enhance the sputtering process without poisoning the sputtering material. The ability to deposit material at high deposition rates will have many commercial applications, including high-throughput manufacturing processes of thick films of exotic materials. Moreover, high-quality material can be deposited in a cost-effective manner. It is also projected that the device will aid in the commercialization of bulk dielectric and semiconductor materials and will have numerous applications to other materials.

The invention surpasses present technology by offering a non-contaminating method, as implemented by a triode sputtering device, to increase the ionization efficiency and hence the overall deposition rate. The device also has the advantage of a cooler operating temperature than a thermionic hollow cathode configuration, allowing the injector means of the device to be composed of low-temperature materials, and thus can apply to a broad range of materials as compared to conventional processes. The transport device can increase the deposition rate of the target material and lower the sputtering pressure, thereby enabling a line-of-sight deposition process.

The transport device is capable of growing bulk material such as aluminum nitride, gallium nitride, and other Group III nitrides and related binary, ternary, and quaternary alloys and compounds. The transport device is also capable of depositing metal in deep trenches for the semiconductor industry.

According to the present invention, the transport device includes a magnetron source and a non-thermionic electron (or, in effect, a plasma) injector assembly to enhance magnetron plasma. Preferably, the electron/plasma injector is disposed just below the surface of a cathode target material, and includes a plurality of non-thermionic, hollow cathode-type injector devices for injecting electrons into a magnetic field produced by a magnetron source. The injector can be scaled in a variety of configurations (e.g., circular or linear) to accommodate various magnetron shapes. When provided in the form of a circular ring, the injector includes multiple hollow cathodes located around the inner diameter of the ring.

The novel transport device constitutes an improvement over the previously developed hollow cathode enhanced magnetron sputtering device described hereinabove, in that the device is a non-thermionic electron emitter operating as a "cold" plasma source and can be composed of the same material as its sputtering target. The injector can be manufactured out of high-purity metals (e.g., 99.9999%), thereby eliminating a source of contamination in the growing film. The addition of the injector to the magnetron sputtering process allows higher deposition rates as compared to rates previously achieved by conventional magnetron sputtering devices. Moreover, the transport device takes advantage of the hollow cathode effect by injecting electrons and plasma into the magnetic field to increase plasma densities without the contamination problem associated with a traditional, thermionic-emitting tantalum tip. As disclosed above, the transport device is further characterized by a decreased operating pressure and an increased ionization rate over conventional magnetron sputtering.

According to one aspect of the present invention, a sputter transport device comprises a sealable, pressure-controlled chamber defining an interior space, a target cathode disposed in the chamber, and a substrate holder disposed in the chamber and spaced at a distance from the target cathode. The target cathode is preferably bonded to a target cathode holder and negatively biased. A magnetron assembly is disposed in the chamber proximate to the target cathode. A negatively-biased, non-thermionic electron/plasma injector assembly is disposed between the target cathode and the substrate holder. In a preferred embodiment of the invention, the injector assembly comprises a plurality of hollow cathode injectors disposed in fluid communication with a gas source. Each hollow cathode includes an orifice communicating with the interior space of the chamber.

According to another aspect of the present invention, an electron/plasma injector assembly is adapted for non-thermionically supplying plasma to a reaction chamber. The injector assembly comprises a main body and a plurality of replaceable or interchangeable gas nozzles. The main body has a generally annular orientation with respect to a central axis, and includes a process gas section and a cooling section. The process gas section defines a process gas chamber and the cooling section defines a heat transfer fluid reservoir. The gas nozzles are removably disposed in the main body in a radial orientation with respect to the central axis and in heat transferring relation to the heat transfer fluid reservoir. Each gas nozzle provides fluid communication between the process gas chamber and the exterior of the main body.

According to yet another aspect of the present invention, a method is provided for depositing a sputtered material at a high deposition rate. A negatively-biased target cathode including a target material is provided in a sealed chamber. A substrate holder is provided in the chamber and spaced at a distance from the target cathode. An operating voltage is applied to the target cathode to produce an electric field within the chamber. A magnetron assembly is provided in the chamber to produce a magnetic field within the chamber. A negatively-biased, non-thermionic electron/plasma injector assembly is provided between the target cathode and the substrate holder to create an intense plasma proximate to the target cathode. A background gas is introduced into the chamber to provide an environment for generating a plasma medium. A portion of the target material is sputtered and transported through the plasma medium toward the substrate holder.

According to still another aspect of the present invention, a metal nitride material such as aluminum nitride, gallium nitride, or a related compound is produced according to the method disclosed herein. Ultra-high growth rates of approximately 0.05 $\mu$m/min to approximately 10 $\mu$m/min, diameters from approximately 1 inch to approximately 8 inches, and a thickness of at least approximately 1 mm or greater, can be achieved.

It is therefore an object of the present invention to provide a novel sputter material transport device capable of ultra-high deposition and growth rates.

It is another object of the present invention to provide a transport device capable of growing both high-purity bulk crystals and thin films having nearly bulk properties and which can be either metallic, semiconducting or dielectric materials.

It is yet another object of the present invention to provide a transport device characterized by lowered processing pressure and higher ionization efficiency.

It is still another object of the present invention to provide a transport device that operates without contamination.

Some of the objects of the invention having been stated hereinabove, other objects will become evident as the description proceeds when taken in connection with the accompanying drawings as best described hereinbelow.

BRIEF DESCRIPTION OF THE DRAWINGS

FIG. 5A is a top plan view of an electron/plasma injector assembly provided according to one embodiment of the present invention;

FIG. 5B is a cut-away vertical cross-sectional view of the injector assembly illustrated in FIG. 5A taken along line 5B—5B thereof;

FIG. 9A is a vertical cross-sectional view of the injector assembly illustrated in FIG. 9 taken along line 9A—9A thereof;

FIG. 9B is a vertical cross-sectional view of the injector assembly illustrated in FIG. 9 taken along line 9B—9B thereof;

DETAILED DESCRIPTION OF THE INVENTION

Figure 1:
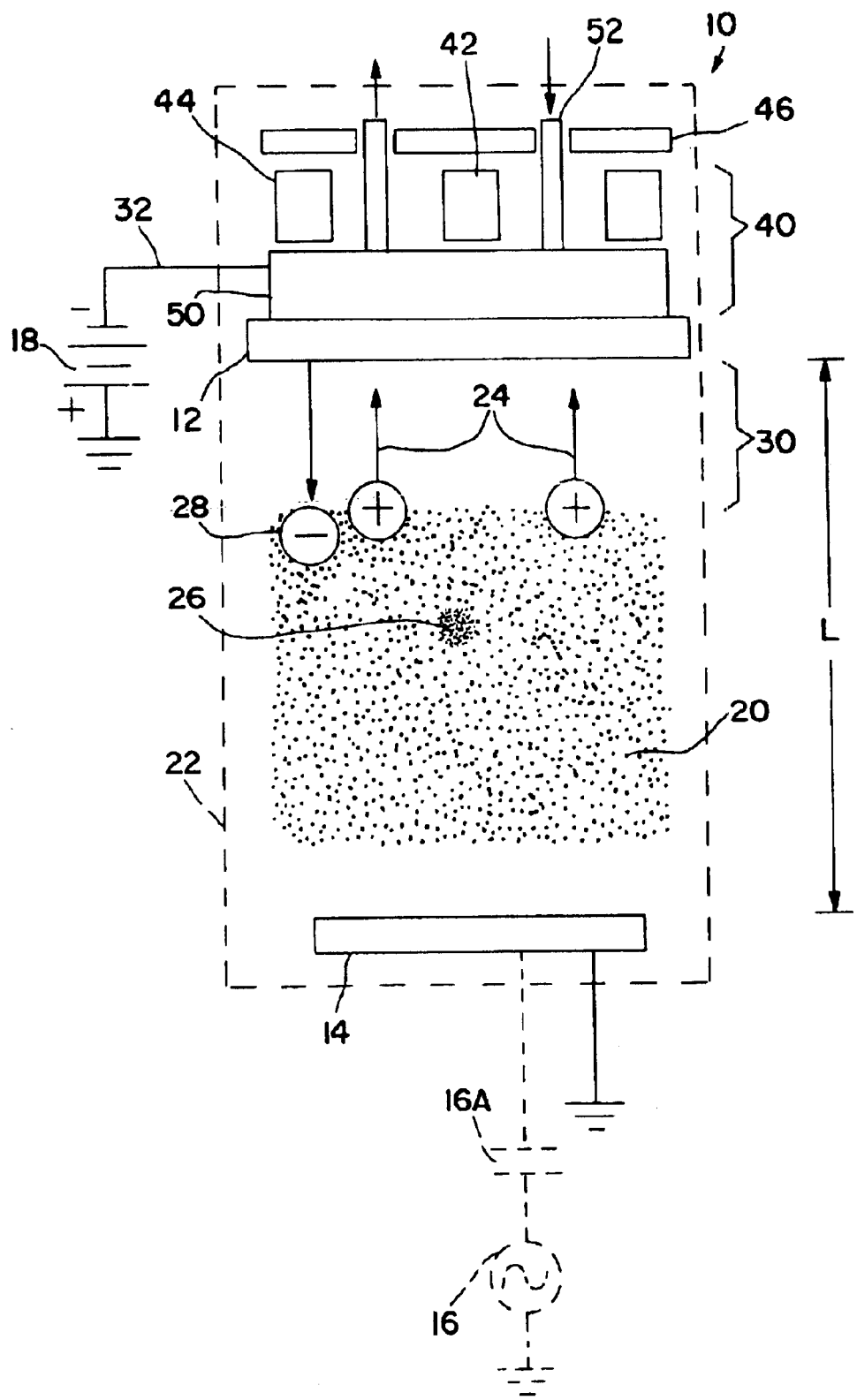
FIG. 1 is a schematic view of a conventional sputter transport device known in the art.
Figure 2:
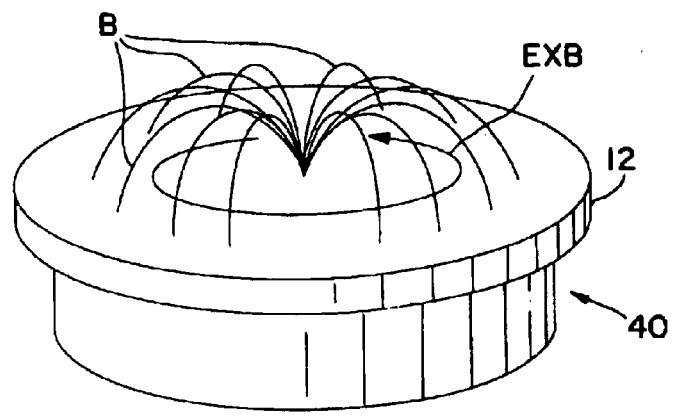
FIG. 2 is a perspective view of a circular magnetron source known in the art.
Figure 3:
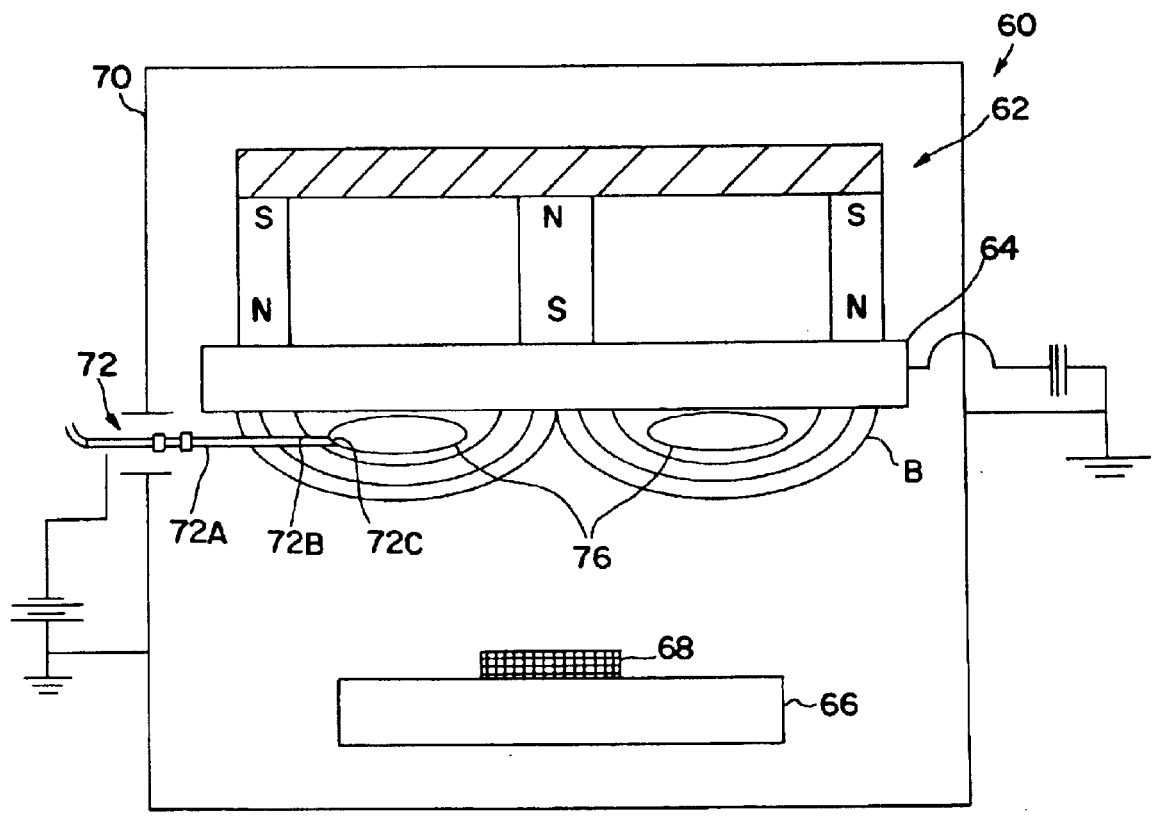
FIG. 3 is a schematic view of a hollow cathode-enhanced sputter transport device known in the art.
Figure 4:
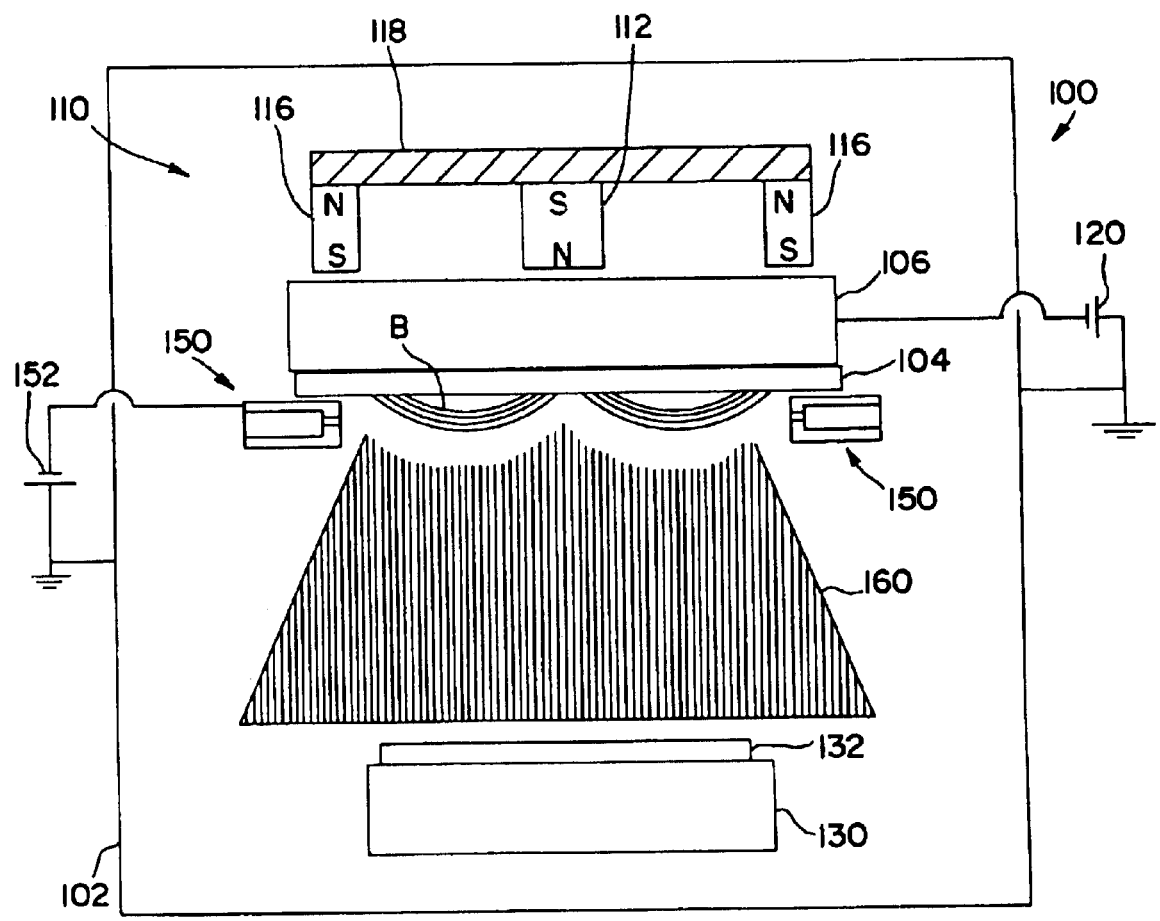
FIG. 4 is a schematic view of a novel sputter transport device according to one embodiment of the present invention.

Referring now to FIG. 4, a sputter transport device generally designated 100 is illustrated according to one embodiment of the present invention. Key operating components of transport device 100 are contained within a grounded, sealable sputter-transport chamber 102. As will be appreciated by persons skilled in the art, a pumping system (not shown) is provided to control the pressure (vacuum or otherwise) within chamber 102. Supply systems (not shown) are also provided for delivering a background gas (e.g., argon), and a reactive gas (e.g., nitrogen) in the case of reactive sputtering, into chamber 102. In some applications of the present invention, the reactive gas may also serve as the background gas.

A cathode 104 constructed from a metallic, dielectric, or compound target material is bonded to a target holder 106 to establish thermal contact therebetween. Target cathode 104 may be provided in the form of a circular disk or a rectilinear plate, or may have some other shape. Target holder 106 is preferably constructed of copper or other relatively inexpensive material that offers acceptable levels of both thermal and electrical conductivity. A heat exchanger system (not shown) is provided to circulate a heat transfer medium such as water through target holder 106 to keep target holder 106 (and thus target cathode 104) cool. In other embodiments, a heater (not shown) can be provided to heat target holder 106. A magnetron assembly 110 includes a set of oppositely-poled magnets 112 and 116 connected by a magnetic field return plate 118. The arrangement of magnets 112 and 116 preferably constitutes a central magnetic bar 112 surrounded by an outer magnetic annulus 116, although other arrangements and shapes could be provided. Magnets 112 and 116 are preferably located on the side of target holder 106 opposite to target cathode 104. If desired, a conventional cooling system (not shown) can be provided to cool magnets 112 and 116. A negative bias voltage is applied to target holder 106 by connecting target holder 106 in series with a voltage source 120.

A substrate holder 130, which serves as the primary anode, is disposed in chamber 102 in parallel with and spaced at a distance from target cathode 104. Preferably the spacing is in the range of approximately 2 cm to 20 cm. Substrate holder 130 can be constructed from any material that is either electrically conductive or isolated, and can be provided as either a cooling structure or a heating structure. It is preferable that transport device 100 be oriented such that target cathode 104 is physically situated opposite to substrate holder 130, but can be either vertically above or below substrate holder 130. A substrate 132 is disposed on substrate holder 130. Depending on the specific application of transport device 100, substrate 132 can be either initially provided in bulk form on which a thin-film is to be deposited, or it represents the growing bulk material grown through use of transport device 100.

As will be appreciated by persons skilled in the art, substrate holder 130 or an associated transfer arm (not shown) can be used to transport substrate holder 130 and, if applicable, an initially-provided substrate material into and out from chamber 102. In addition, a load lock or similar component (not shown) can be provided to serve as an interface between chamber 102 and the ambient environment to assist in maintaining reduced pressure in chamber 102 when substrate holder 130 and/or an initially-provided substrate material is loaded and thereafter removed from chamber 102. Other known processing components can used as appropriate to assist in implementing the methods of the invention involving the use of transport device 100, including an electronic control system, a power supply system, a pressure monitoring system, a mass flow control system, a temperature monitoring system, and a system for automated tracking and transport of workpieces.

As one key aspect of the present invention, an injector assembly generally designated 150 is disposed in chamber 102 proximate to target cathode 104, and is separately, negatively biased through its serial connection with a voltage source 152. Hence, injector assembly 150 serves as a cathode apart from and additional to target cathode 104, such that transport device 100 can be characterized as being a triode sputtering source.

Referring to FIGS. 5A and 5B, injector assembly 150 includes a plurality of injectors 152 serving essentially as individual hollow cathodes. Each injector 152 terminates in an inlet orifice 152A communicating with the interior of chamber 102 in the region proximate to the surface of target cathode 104. In the present embodiment, injector assembly 150 takes the form of an injector ring such that each inlet orifice 152A faces radially inwardly with respect to chamber 102, although individual injectors 152 can be arranged in a linear or other suitable configuation.

Figure 6:
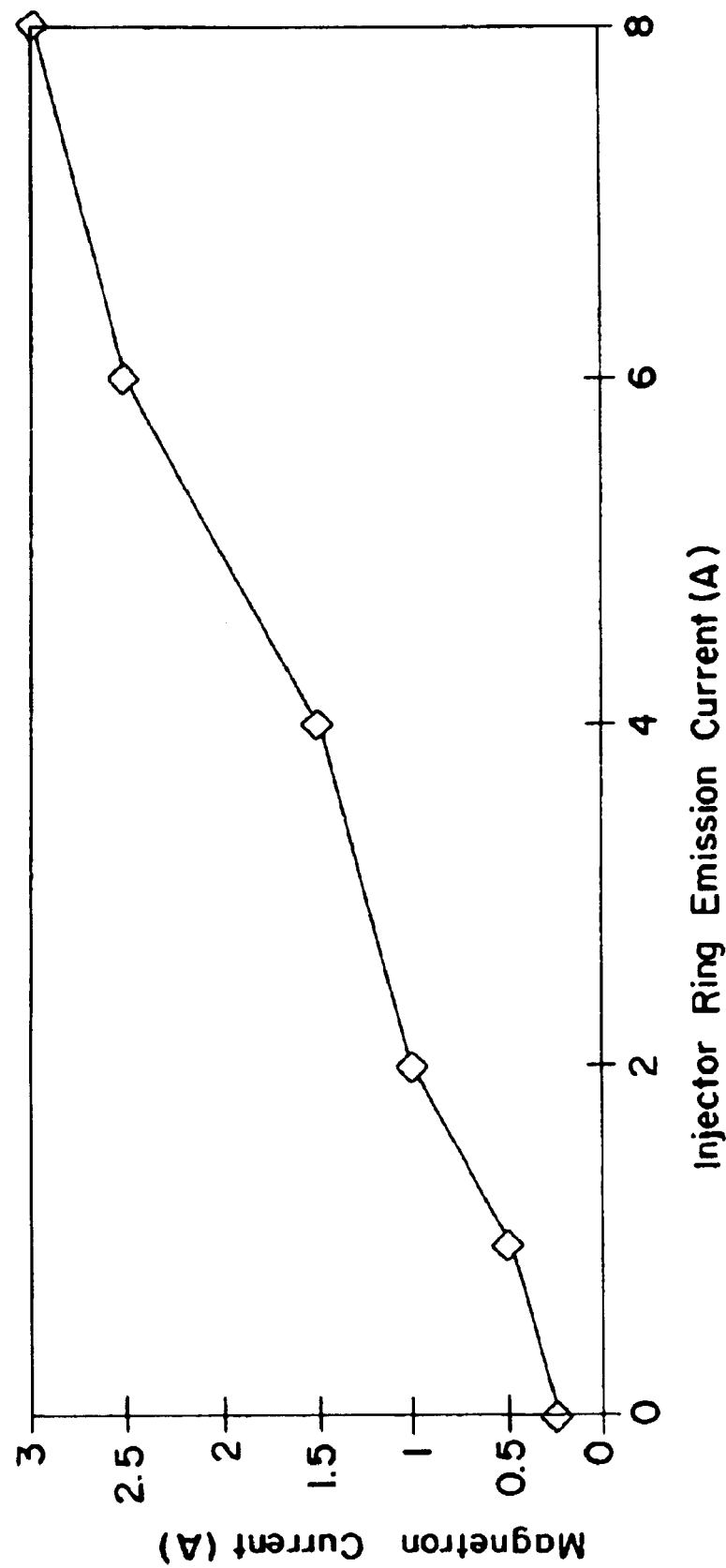
FIG. 6 is a plot of electron injector ring current versus magnetron current exemplifying performance of the transport device illustrated in FIG. 4.

In operation, electrons in the form of supplemental or auxiliary plasma beams are non-thermionically emitted from injectors 152 as a result of the increase in electric field strength at these points, such that the electrons are subsequently injected and coupled into the gradient of the magnetic field (represented by virtual field lines B) established by magnetron source 110 to generate an intense plasma. Injector assembly 150 may thus be characterized as a cool, non-thermionic electron/plasma source which injects an approximately equal number of ions and electrons into the region illustrated in FIG. 4 proximate to target cathode 104, thereby creating a higher probability of ionization of the target material. FIG. 6 is a graph of magnetron current at a constant applied voltage as a function of injector ring emission current. The slope of the curve indicates a measure of electron coupling into the magnetron discharge. An increase in magnetron current is observed due to the added electrons from injector assembly 150. This effect can be seen as a significant increase in the plasma brightness, as well as a significant increase in the sputter deposition rate. The intense plasma created in the proximity of the surface of target cathode 104 results in the significant increase in deposition rate by more than ten times over conventional techniques. Injector assembly 150 also serves to electrostatically confine the plasma to form a broad plasma beam 160 directed toward substrate 132. Due to the bulk mass and/or cooling design of injector assembly 150, its temperature remains low and accordingly no thermionic emission, evaporation or contamination takes place during deposition.

Transport device 100 can be operated in either continuous DC, pulsed DC, AC or RF mode, which enables transport device 100 to reactively sputter a wide range of both conductive and insulating materials at very high rates. Due to the high percentage of gas ionization, the material of target cathode 104 is sputtered at ultra-high rates sufficient to prevent a detrimental insulating layer from forming on the target surface. In addition, due to the very high ion energies associated with the process according to the present invention, large amounts of material can be-sputtered. Device 100 has been proven to operate successfully in 100% reactive gas environments, therefore demonstrating the stability of the device under very reactive conditions.

As described above, a negative bias is applied to target holder 106, which generates a magnetron sputtering discharge, and a separate negative bias is applied to injector assembly 150. This generates a very intense plasma, with beamlets of plasma emitting from each injector 152 of injector assembly 150. The added plasma density and ionization percentage in the region of the target cathode 104 increase the amount of target bombardment, thereby causing increased sputter rates. Due to the increased utilization of sputtering gas, the background processing pressure can be lowered from, for example, approximately 5 mTorr to approximately 0.1 mTorr, which can improve the microstructural properties of materials being formed. This pressure decrease increases the mean free path of molecules, enabling the creation of plasma beam 160 between target cathode 104 and substrate holder 130 (i.e., the anode) which is characterized by very high ionization efficiency and achievement of ultra-high sputter transport rates.

Figure 7:
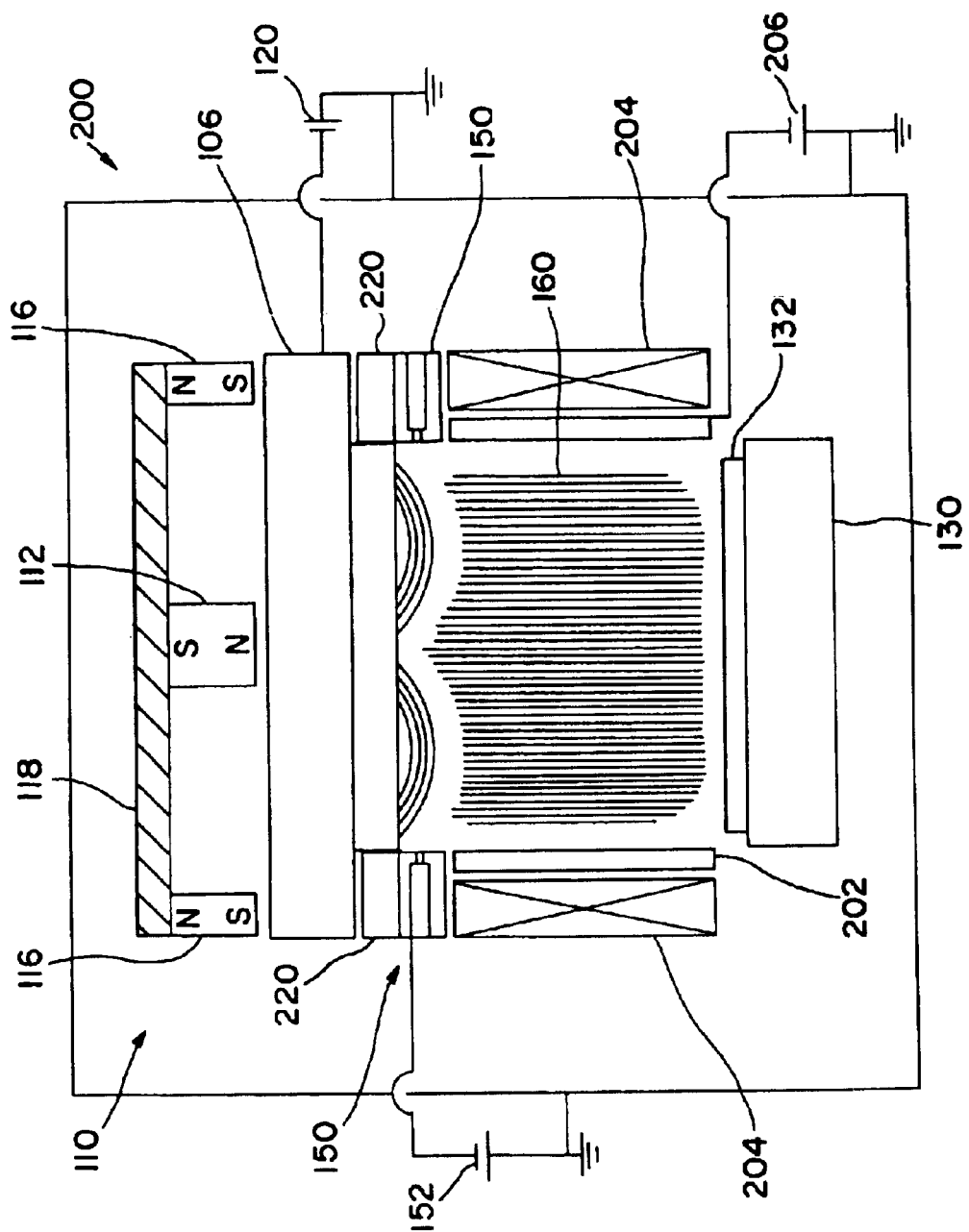
FIG. 7 is a schematic view of a novel sputter transport device according to a further embodiment of the present invention.
Figure 8:
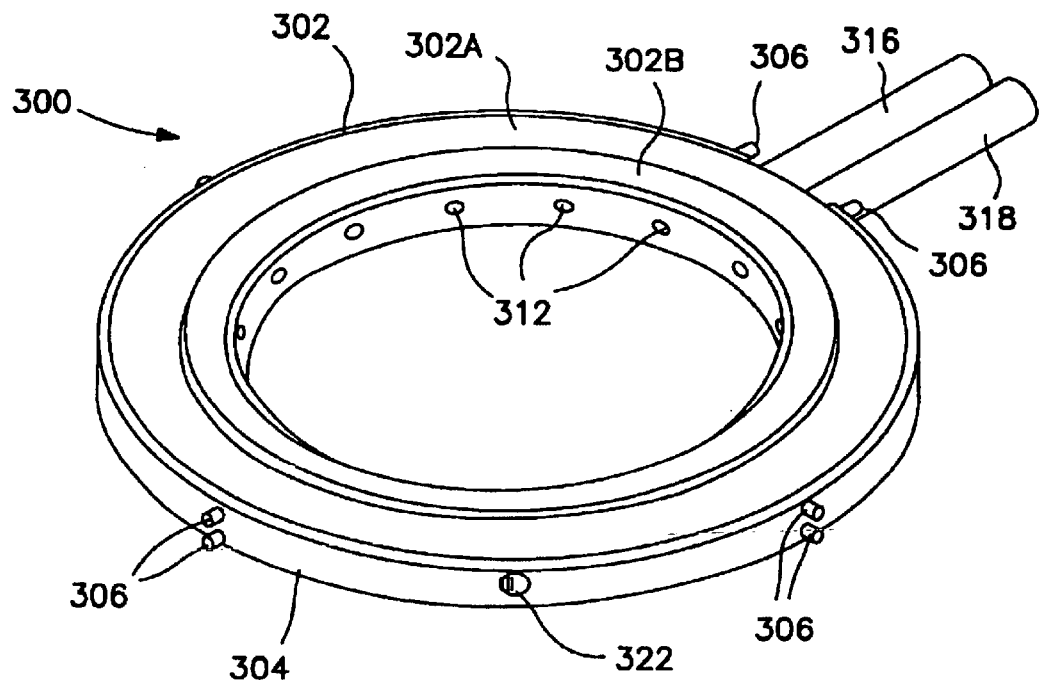
FIG. 8 is a perspective view of an electron/plasma injector assembly according to another embodiment of the present invention.
Figure 9:
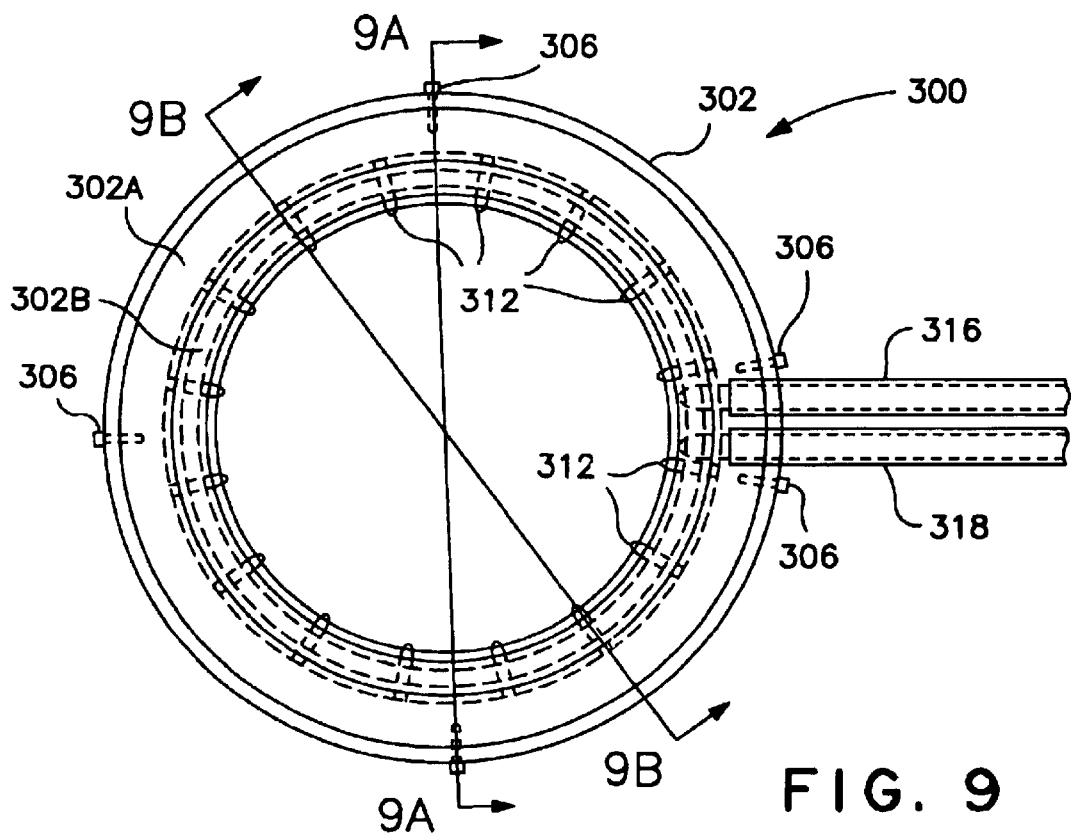
FIG. 9 is a top plan schematic view of the injector assembly illustrated in FIG. 8.
Figure 10A:
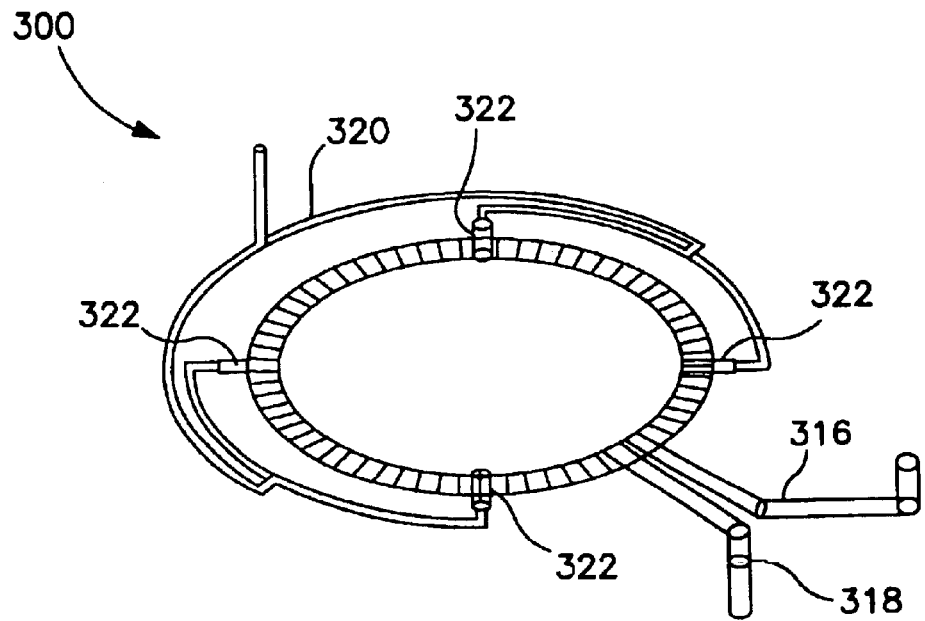
FIG. 10A is another perspective view of the injector assembly illustrated in FIG. 8.
Figure 10B:
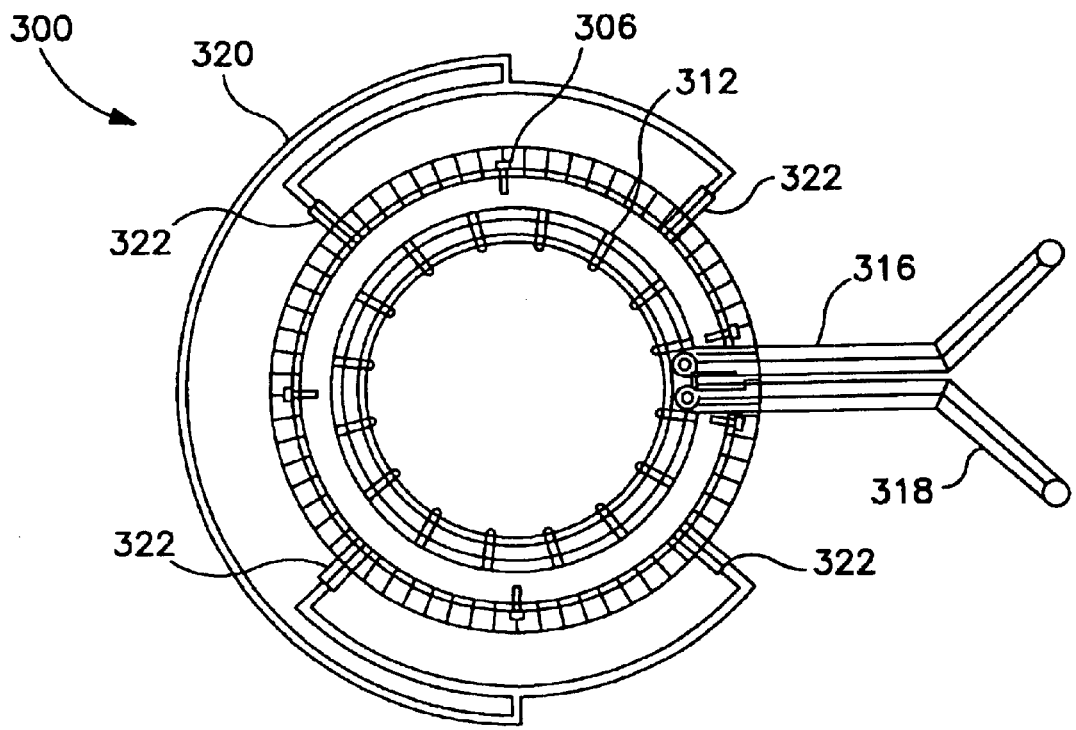
FIG. 10B is a top plan view of the injector assembly illustrated in FIG. 8.

Referring to FIG. 7, a sputter transport device, generally designated 200, is illustrated according to another embodiment of the present invention. In this particular embodiment, a biased containment shield 202, constructed from aluminum or other conductive material, is disposed in chamber 102 between target cathode 104 and substrate holder 130 and is surrounded by a containment magnet or magnets 204. A high voltage applied to containment shield 202 from a voltage source 206 acts to focus the sputtered material and plasma beam 160 onto the growing substrate 132, thereby increasing the transport efficiency of the sputtered material (such as aluminum nitride) to substrate 132. Ions and electrons become trapped within the containment region under the influence of the electric and magnetic fields and subsequently deposit on substrate 132.

Under some circumstances, the user of transport device 100 or 200 might find that the heating of injector assembly 150 causes low-melting-point metals to melt. This problem can be overcome by cooling injector assembly 150 with a copper cooling ring 220, which is also illustrated in FIG. 7.

Figure 11:
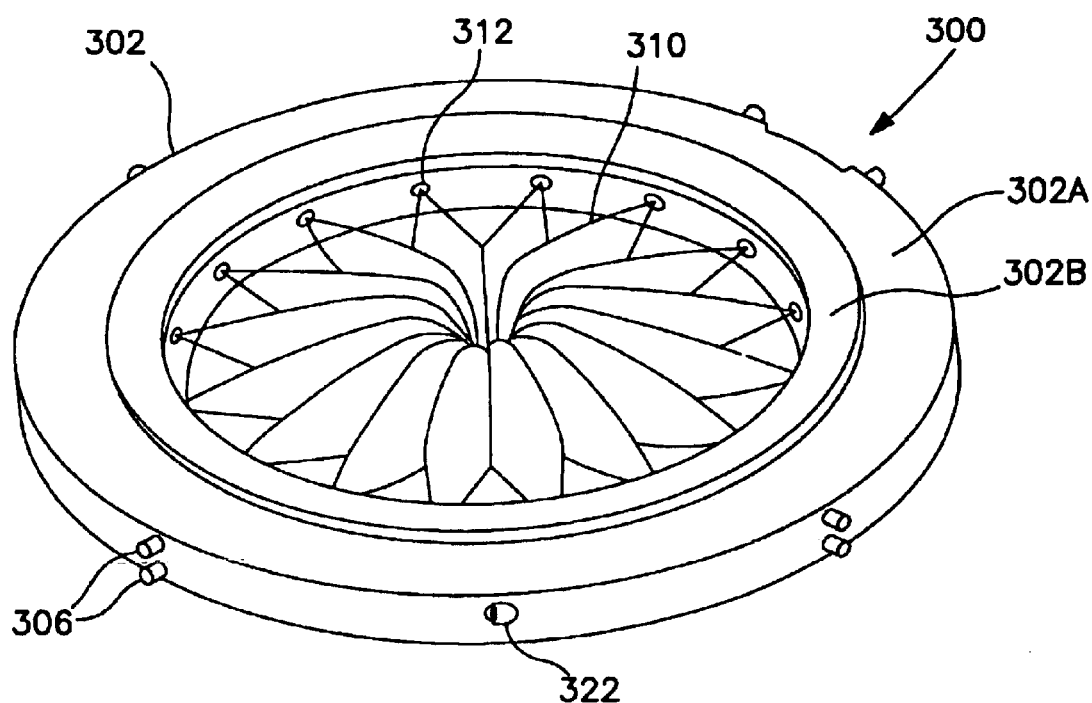
FIG. 11 is a perspective view of the injector assembly illustrated in FIG. 8 showing the operation thereof and an exemplary electron/plasma injection pattern.

Referring to FIGS. 8–11, a preferred embodiment of a fluid-cooled, ring-shaped injector assembly generally designated 300 is illustrated. Injector assembly 300 includes a main body 302 and an outer collar 304 removably secured by clamping screws 306. Main body 302 includes a process gas section 302A and a cooling section 302B. As best shown in FIGS. 9A and 9B, process gas section 302A and outer collar 304 together define a process gas chamber 308. Individual injectors for supplying electrons and cool plasma, indicated by the reference numeral 310, are defined by interchangeable gas nozzles 312 fluidly communicating with process gas chamber 308 at one end and with sputter-transport chamber 102 at the other end. Gas nozzles 312 may or may not be constructed from the same material as target cathode 104 and/or containment shield 202. Cooling section 302B of main body 302 defines a cooling reservoir 314 adapted to circulate a heat transfer fluid such as water in close proximity to each gas nozzle 312. The heat transfer fluid is circulated through cooling reservoir 314 by means of a heat transfer fluid inlet conduit 316 and outlet conduit 318. Process gas such as diatomic nitrogen or argon is supplied to injector assembly 300 by means of a process gas conduit system 320 that communicates with one or more process gas inlets 322 on main body 302. FIG. 11 illustrates one example of an emission pattern of plasma/electrons 310 obtainable by injector assembly 300. The pattern as well as the gas nozzle pressure can be altered by blocking one or more of individual gas nozzles 312.

Traditionally, sputter-deposited films have been plagued with low reactive sputter rates, excessive stress, and poor crystalline growth. Due to the non-contaminating nature of transport device 100 or 200, however, the hollow cathode effect can be advantageously utilized to produce both single-crystal and highly-oriented polycrystalline, bulk-form substrates at lower pressures, ultra-high deposition rates, and with minimal material stress. Transport device 100 or 200 is also capable of growing epitaxial layers on substrates. Examples of deposited materials include binary, tertiary, and quaternary Group III nitride based compounds such as aluminum nitride, gallium nitride, indium nitride, aluminum gallium nitride, indium gallium nitride and aluminum indium gallium nitride, and alloys thereof. Suitable dopants can be added during the growth process. Both single-crystal and polycrystalline morphologies are obtainable. In one specific example, transport device 100 or 200 is capable of growing aluminum nitride purer than that made by powder processing methods and faster than CVD methods. Moreover, because transport device 100 or 200 exhibits a very high degree of sputter particle ionization, transport device 100 or 200 produces a plasma beam environment that facilitates the synthesis of nitride based materials. The material grown by transport device 100 or 200 exhibits the bulk properties of nitrides due to the resulting high crystallinity and purity. In particular, bulk aluminum nitride produced from transport device 100 or 200 has a high IR and UV transmittance, a high thermal conductivity, and a high degree of c-axis orientation.

In addition to growing the materials described hereinabove, transport device 100 or 200 can be utilized to grow a variety of ceramic thin films such as aluminum oxide and zinc oxide, or to deposit copper or other metallic interconnects onto patterned electronic devices. The high transport rate also enables the high-throughput coating of objects.

Figure 12:
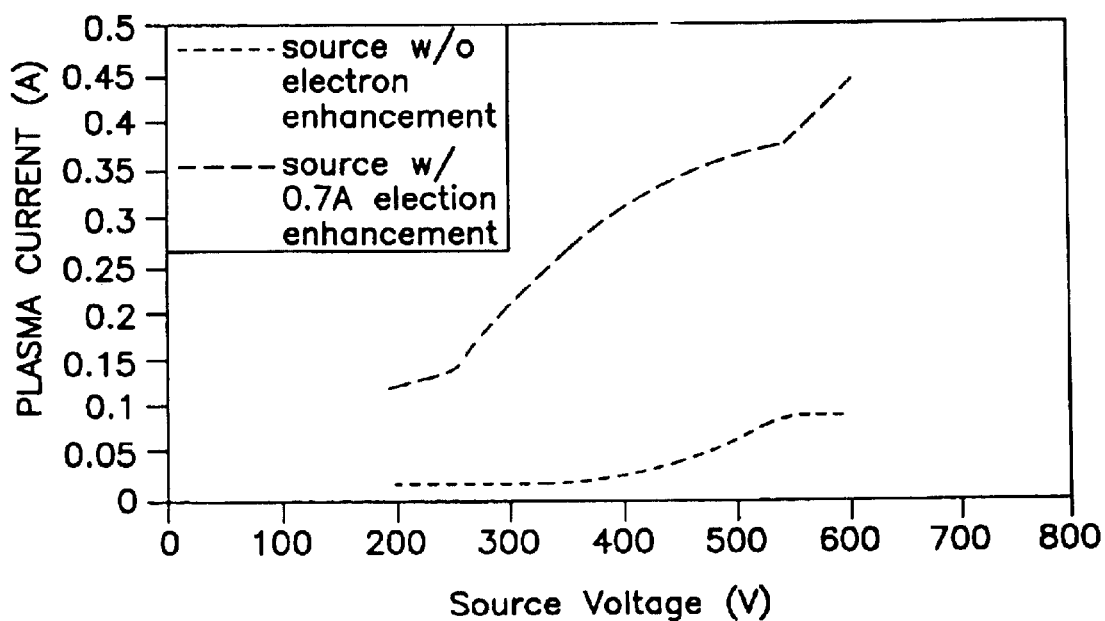
FIG. 12 is a plot comparing the source performance of a transport device provided according to the present invention and that of a conventional magnetron source.

FIG. 12 demonstrates the dramatic improvement in deposition rate by plotting plasma current as a function of applied source voltage with transport device 100 operating under a 0.7 A electron enhancement (i.e., with the inventive injector ring installed and supplying current from hollow cathode-type structures), as compared to a typical magnetron sputtering device without any electron enhancement.

Figure 13:
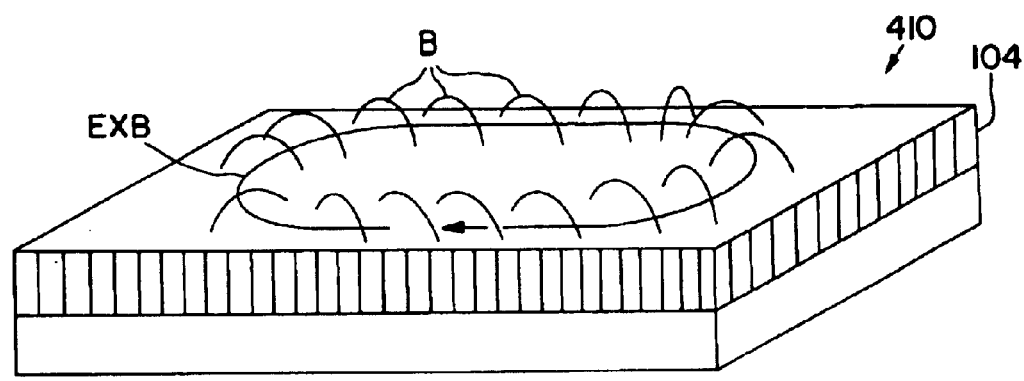
FIG. 13 is a perspective view of a rectangular magnetron source which can be employed in combination with the present invention.

Conventional planar magnetron designs suffer from poor target-material utilization because of a trenched erosion pattern that tends to form on the surface of the target material in the vicinity of the E×B drift path of the beam electrons. The radial narrowness of this trench results from radial compression of the plasma, which is in turn caused by the well-known "magnetic-mirror" effect. The electrons of the plasma are forced away from both small and large magnetron radii at the sites where the magnetic field converges toward the magnetic pole pieces. The electrons are compressed by these mirrors toward an intermediate radius where the magnetic field is uniform. Both the plasma and the ion bombardment are most intense in the region of magnetic field uniformity. The magnetic-mirror effect can be reduced somewhat by designing a flatter magnetic field or by mechanically scanning the magnets back and forth during sputtering. The non-uniformity of film thickness resulting from plasma compression can be avoided by moving the substrates around during deposition. One simpler, geometric approach to improving uniformity is illustrated in FIG. 13, wherein a rectangular magnetron generally designated 410 is utilized. With the rectangular geometry, the many of magnetic field lines B are situated along linear directions, and the beam electrons follow an oblong or "racetrack" E×B drift path at target cathode 104. The rectangular magnetron shape can be employed in connection with the present invention if non-uniformity becomes problematic.

Localization of the plasma over target cathode 104 by the transverse magnetic field of magnetron assembly 110 results in a much lower plasma density over the substrate 132 than in the case of the non-magnetron planar diode, and ion bombardment flux to substrate 132 is reduced accordingly. This is desirable when the neutral sputtered particles alone carry sufficient kinetic energy to optimize film structure, or when it is important that the substrate heating that results from ion bombardment be kept to a minimum. In other cases, however, it might be desirable to further increase film bombardment while retaining the low operating pressure of the transport device 100 or 200. One method for increasing ion bombardment of the growing film is to "unbalance" the magnets of magnetron assembly 110, such as by downsizing central magnet 112 such that the central magnet 112 cannot pull in all the field lines emanating from outer magnets 116. Hence, in the unbalanced configuration, the magnetic field lines that are not pulled into central magnet 112 will curve away toward substrate holder 130. Because electrons traveling parallel to a magnetic field are not influenced by the magnetic field, they can escape along these wayward field lines and travel toward substrate 132. The escaping electrons pull positive ions along with them by ambipolar diffusion and hence increase ion-bombardment flux to substrate 132. In addition, the bombardment energy can be increased by negatively biasing substrate 132.

Another way to increase ion-bombardment flux to the growing film is to provide an RF-powered coil to ionize the mostly neutral sputtered-particle flux during transport to substrate 132. The coil operates by coupling energy inductively into a secondary plasma downstream of the magnetron plasma.

Figure 14:
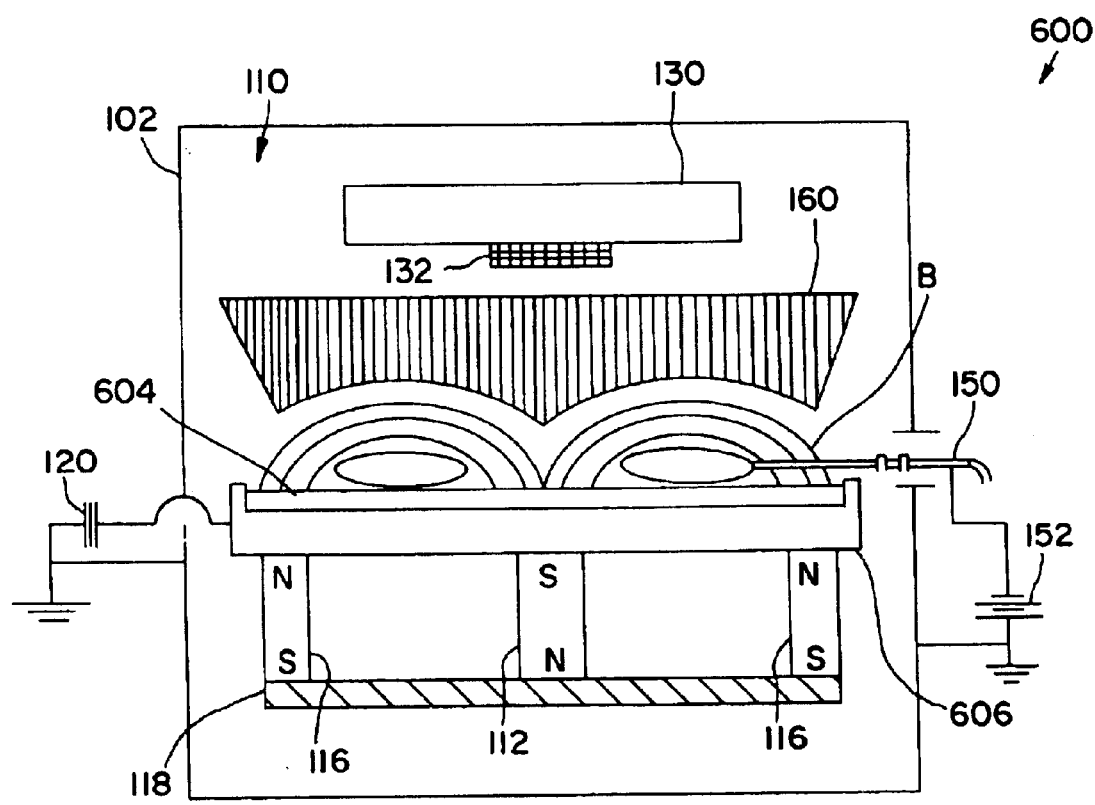
FIG. 14 is a schematic view of a novel sputter transport device according to an additional embodiment of the present invention.

Referring now to FIG. 14, a sputter transport device, generally designated 600, is illustrated according to an additional embodiment of the present invention. Many of the components of sputter transport device are similar to those of sputter transport device 100 shown in FIG. 4. In particular injector assembly 150 as described above is utilized to enhance the material transport process. A primary difference is that a liquid target 604 such as liquid-phase aluminum or gallium is provided as a source species. The target holder in this embodiment is provided in the form of a cup 606 to contain the liquid target material. Preferably, this target holder should be constructed from a material suitable for withstanding the heat involved and which will not contaminate the target material. Candidate materials for target holder 606 include molybdenum and stainless steel. In one embodiment, a 6" diameter molybdenum liquid gallium or aluminum target holder 606 is employed to prevent reaction of the holder with a high purity (99.9999%) liquid gallium or aluminum source 604. In order to obtain a flat uniform liquid surface of the gallium or aluminum, sufficient wetting of the gallium or aluminum to the molybdenum holder 606 must occur. To this end, grooves can be cut into the bottom of target holder 606 to increase its surface area and thereby increase its wettability. In addition, a breathing hole connecting the grooves can be provided to eliminate any gas trapped under the liquid gallium or aluminum.

Figure 15:
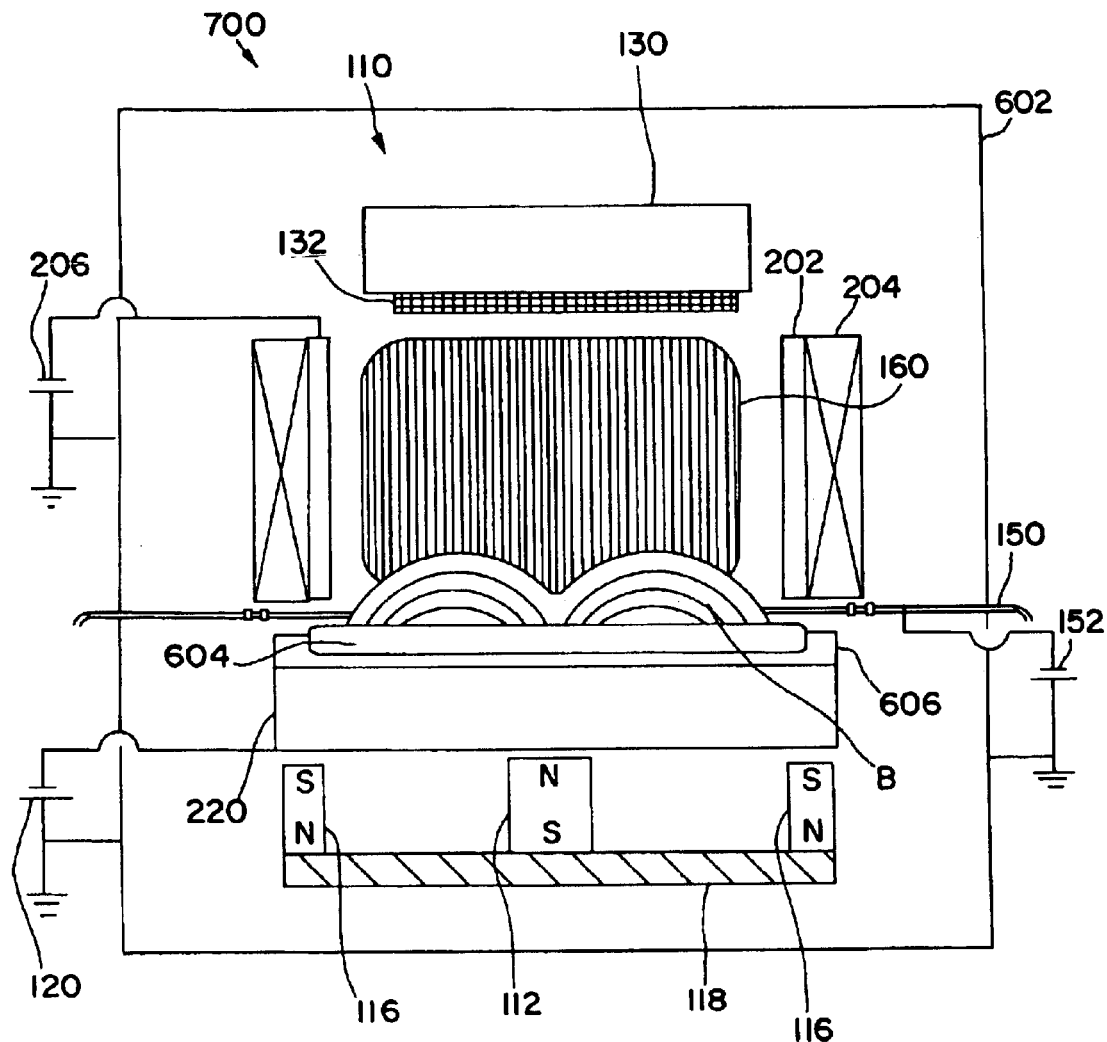
FIG. 15 is a schematic view of a novel sputter transport device according to a yet another embodiment of the present invention.

Referring now to FIG. 15, a sputter transport device, generally designated 700, is illustrated according to another embodiment of the present invention. Sputter transport device 700 is equipped with a biased containment shield 202 and containment magnets 204, similar to those described in reference to FIG. 7. A high voltage applied to containment shield 202 will focus the sputtered material onto growing substrate or film 132, thereby increasing the transport efficiency of Ga or Al to substrate or film 132.

Sputter transport devices 600 and 700 operate as described above. Gallium (or aluminum) particles sputtered from the cathode react with atomic nitrogen in the cathode magnetic fields. The gallium nitride (or aluminum nitride) particles travel through the containment magnetic field to the substrate. The quality of growth material is determined by the nucleation and growth at the substrate surface.

It will be understood that various details of the invention may be changed without departing from the scope of the invention. Furthermore, the foregoing description is for the purpose of illustration only, and not for the purpose of limitation—the invention being defined by the claims.

What is claimed is:

1. A sputter transport device comprising:
    (a) a sealable, pressure-controlled chamber defining an interior space;
    (b) a target cathode disposed in the chamber;
    (c) a magnetron assembly disposed in the chamber proximate to the target cathode;
    (d) a substrate holder disposed in the chamber and spaced at a distance from the target cathode; and
    (e) a negatively-biased, non-thermionic electron/plasma injector assembly disposed between the target cathode and the substrate holder.

2. The device according to claim 1 comprising a reactive gas supply source fluidly communicating with the chamber.

3. The device according to claim 2 wherein the reactive gas supply source is adapted to supply a gas to the chamber, and the gas includes a component selected from the group consisting of nitrogen, oxygen, and hydrogen.

4. The device according to claim 1 comprising a background gas supply source fluidly communicating with the chamber.

5. The device according to claim 4 wherein the background gas supply source is adapted to supply a gas including argon.

6. The device according to claim 1 wherein the target cathode is negatively biased.

7. The device according to claim 1 wherein the target cathode has a circular configuration.

8. The device according to claim 1 wherein the target cathode has a rectilinear configuration.

9. The device according to claim 1 wherein the target cathode is constructed from a material selected from the group consisting of conducting, semiconducting, and insulating materials.

10. The device according to claim 1 wherein the target cathode has a composition including a Group III material.

11. The device according to claim 10 wherein the Group III material is selected from the group consisting of aluminum, gallium, indium, and binary, ternary, and quaternary alloys and compounds thereof.

12. The device according to claim 1 wherein the target cathode includes zinc.

13. The device according to claim 1 comprising a heat exchanger system adapted to circulate a heat transfer medium to remove heat from the target cathode.

14. The device according to claim 1 comprising a target cathode holder disposed in the chamber, wherein the target cathode is supported by the target cathode holder.

15. The device according to claim 14 wherein the target cathode holder is cup-shaped and the target cathode comprises a liquid-phase component.

16. The device according to claim 15 wherein the target cathode holder is constructed from a material selected from the group consisting of metallic and insulating materials.

17. The device according to claim 15 wherein the target cathode holder is constructed from a component selected from the group consisting of molybdenum and stainless steel.

18. The device according to claim 14 comprising a voltage source communicating with the target cathode holder, wherein the target cathode is negatively biased.

19. The device according to claim 14 comprising a heat exchanger system adapted to circulate a heat transfer medium to remove heat from the target cathode holder.

20. The device according to claim 14 in which the target cathode holder is heated.

21. The device according to claim 1 wherein the magnetron assembly is cooled.

22. The device according to claim 1 wherein the magnetron assembly has a circular configuration.

23. The device according to claim 1 wherein the magnetron assembly has a rectilinear configuration.

24. The device according to claim 1 wherein the magnetron assembly includes a plurality of magnets including a centrally disposed magnet and a radially disposed magnet oppositely poled with respect to the centrally disposed magnet.

25. The device according to claim 1 wherein the magnetron assembly includes a plurality of magnetron magnets arranged in an unbalanced configuration.

26. The device according to claim 1 wherein the substrate holder is negatively biased.

27. The device according to claim 1 wherein the injector assembly is constructed from the same material as the target cathode.

28. The device according to claim 1 wherein the injector assembly is constructed from a material different from the target cathode.

29. The device according to claim 1 wherein the injector assembly has a circular configuration.

30. The device according to claim 1 wherein the injector assembly has a linear configuration.

31. The device according to claim 1 wherein each injector of the injector assembly includes a replaceable nozzle.

32. The device according to claim 31 wherein each nozzle is constructed from the same material as the target cathode.

33. The device according to claim 31 wherein each nozzle is constructed from a material different from the target cathode.

34. The device according to claim 1 comprising an injector assembly holder secured to the injector assembly and adapted to circulate a heat transfer medium to remove heat from the injector assembly.

35. The device according to claim 1 wherein the injector assembly comprises a plurality of hollow cathode injectors disposed in fluid communication with a gas source, each injector including an orifice communicating with the interior space of the chamber.

36. The device according to claim 35 wherein the injector assembly comprises:
(a) a main body having a generally annular orientation with respect to a central axis and including a process gas section and a cooling section, the process gas section defining a process gas chamber and the cooling section defining a heat transfer fluid reservoir; and
(b) a plurality of gas nozzles removably disposed in the main body in a radial orientation with respect to the central axis and in heat transferring relation to the heat transfer fluid reservoir, each gas nozzle providing fluid communication between the process gas chamber and a region exterior to the main body.

37. The device according to claim 1 comprising a containment shield and a containment magnet, the containment shield disposed between the target cathode and the substrate holder and the containment magnet disposed adjacent to the containment shield.

38. The device according to claim 37 wherein the containment shield is negatively biased.

39. The device according to claim 37 wherein the containment shield is constructed from the same material as the target cathode.

40. The device according to claim 37 wherein the containment shield is constructed from a material different from the target cathode.

41. The device according to claim 37 wherein the containment shield is constructed from aluminum.

42. An electron/plasma injector assembly adapted for non-thermionically supplying plasma to a reaction chamber, the injector assembly comprising:
(a) a main body having a generally annular orientation with respect to a central axis and including a process gas section and a cooling section, the process gas section defining a process gas chamber and the cooling section defining a heat transfer fluid reservoir; and
(b) a plurality of gas nozzles removably disposed in the main body in a radial orientation with respect to the central axis and in heat transferring relation to the heat transfer fluid reservoir, each gas nozzle providing fluid communication between the process gas chamber and a region exterior to the main body.

43. The device according to claim 42 wherein each injector of the injector assembly includes a replaceable nozzle.

44. The device according to claim 42 comprising an injector assembly holder secured to the injector assembly and adapted to circulate a heat transfer medium to remove heat from the injector assembly.

45. A sputter transport device comprising:
(a) a sealable, pressure-controlled chamber;
(b) a target cathode holder disposed in the chamber;
(c) a magnetron assembly disposed in the chamber proximate to the target cathode;
(d) a substrate holder disposed in the chamber and spaced at a distance from the target cathode holder; and
(e) a negatively-biased, non-thermionic electron/plasma injector assembly disposed between the target cathode and the substrate holder, the injector assembly comprising:
(i) a main body having a generally annular orientation with respect to a central axis and including a process gas section and a cooling section, the process gas section defining a process gas chamber and the cooling section defining a heat transfer fluid reservoir; and
(ii) a plurality of gas nozzles removably disposed in the main body in a radial orientation with respect to the central axis and in heat transferring relation to the heat transfer fluid reservoir, each gas nozzle providing fluid communication between the process gas chamber and a region exterior to the main body.

46. The device according to claim 45 wherein the target cathode holder is negatively biased.

47. The device according to claim 45 comprising a heat exchanger system adapted for circulating a heat transfer medium to remove heat from the target cathode.

48. The device according to claim 45 wherein the target cathode holder is generally cup-shaped and supports a target cathode comprising a liquid-phase component.

49. The device according to claim 45 wherein the target cathode holder supports a target cathode.

50. The device according to claim 49 wherein the target cathode comprises a Group III material.

51. The device according to claim 50 wherein the Group III material is selected from the group consisting of aluminum, gallium, indium, and binary, ternary, and quaternary alloys and compounds thereof.

52. The device according to claim 49 wherein the injector assembly is constructed from the same material as the target cathode.

53. The device according to claim 49 wherein the injector assembly is constructed from a material different from the target cathode.

54. The device according to claim 45 wherein each injector of the injector assembly includes a replaceable nozzle.

55. The device according to claim 54 wherein each nozzle is constructed from the same material as a target cathode supported by the target cathode holder.

56. The device according to claim 54 wherein each nozzle is constructed from a material different from a target cathode supported by the target cathode holder.

57. The device according to claim 45 comprising an injector assembly holder secured to the injector assembly and adapted to circulate a heat transfer medium to remove heat from the injector assembly.

* * * * *